United States Patent [19]

Greaves

[11] 4,147,997
[45] Apr. 3, 1979

[54] ACTIVE FILTERS UTILIZING NETWORKS OF RESISTORS AND NEGATIVE IMPEDANCE CONVERTERS

[75] Inventor: Alan J. Greaves, Needham Market, England

[73] Assignee: The Post Office, London, England

[21] Appl. No.: 808,090

[22] Filed: Jun. 20, 1977

[30] Foreign Application Priority Data

Jun. 23, 1976 [GB] United Kingdom ............... 26124/76

[51] Int. Cl.$^2$ ....................... H03H 7/02; H03H 11/00
[52] U.S. Cl. .................................... 333/214; 330/107; 333/216
[58] Field of Search .................. 330/107, 109, 303; 333/80 R, 80 T

[56] References Cited

U.S. PATENT DOCUMENTS

| 2,788,496 | 4/1957 | Linvill | 333/80 R |
| 3,219,952 | 11/1965 | Saraga | 333/80 R |
| 3,364,435 | 1/1968 | Hurtig | 330/303 |
| 3,731,218 | 5/1973 | Saunders et al. | 333/80 R X |

Primary Examiner—Paul L. Gensler
Attorney, Agent, or Firm—Hall & Houghton

[57] ABSTRACT

A construction of an active filter having the same characteristics as a predetermined passive filter is described in which the capacitors of the passive filters are replaced by a topologically equivalent first network of resistors and the inductors of the passive network are replaced by a topologically equivalent second network of resistors, the two networks of the resistors being interconnected in a manner corresponding to the connections in the passive filter and connected to points corresponding to interconnection points of the passive filter by means of negative impedance converters, the converters connected to the first network having conversion ratios effective to convert resistance into negative capacitance and the converters connected to the second network having conversion ratios effective to convert resistance into negative inductance. The input and output to the active filter may be through similar negative impedance converters or may be directly to points in one or other resistive networks. An additional resistor connected between points of the active filter which correspond to terminals of a resonance circuit in the passive filter can provide Q-factor enhancement. A suitable design of negative impedance converter uses an operational amplifier the two inputs of which respectively form the input and output terminals of the converter with impedances connected from the output of the amplifier to its inputs.

11 Claims, 9 Drawing Figures

ACTIVE FILTERS UTILIZING NETWORKS OF RESISTORS AND NEGATIVE IMPEDANCE CONVERTERS

This invention relates to active filters, and in particular to the construction of such filters having the same characteristics as a passive filter formed by inductors and capacitors, with or without other components.

Filters are required in every branch of electrical and radio communication. With the advent of integrated circuits amplifying elements of high gain can be made cheaply and of very small size and power consumption. Filters of conventional design using inductors and capacitors, particularly those for low frequencies, are not amenable to construction of a size compatible with that of integrated circuits. For example, inductors of large value are of large size and have to be produced as separate components.

In order to overcome this difficulty it has been proposed to use gyrators constructed from integrated circuit amplifiers to cause a capacitor having one earthed terminal to behave as an inductor having one earthed terminal. More complex gyrator circuits can be devised to replace an inductor having neither terminal earthed.

It is an object of the present invention to provide an active filter having the same characteristics as a passive filter of given design.

According to one aspect of the present invention there is provided an active filter having the same characteristics as a predetermined passive filter formed by capacitors including at least one capacitor not directly connected to earth and inductors with or without other components, the active filter including one or more first sets of one or more resistors connected in networks topologically equivalent to the capacitors in the passive filter, one or more second sets of one or more resistors connected in networks topologically equivalent to the inductors in the passive filters, a first plurality of generalised negative impedance converters having conversion ratios effective to convert resistances into negative capacitances and respectively connected from nodes of the first set or sets to input, output or junction points, and a second plurality of generalised negative impedance converters having conversion ratios effective to convert resistances into negative inductances and respectively connected from nodes of the second set or sets to the input, output or junction points, the input, output or junction points corresponding to input, output or junction points of the passive filter.

One or more other negative impedance converters may be connected from junction points of the active filter which correspond to junction points of the passive filter which serve as input or output points for that filter. Such other negative impedance converters would serve as buffer elements for input and output connections to the active filter; they are required because of the negation of the impedances within the active filter itself.

As an alternative or in addition to such buffer elements either or both of the input and output connections may be joined to one or more of the first and second sets of resistors, each connection being through an inductor, capacitor, resistor or even a direct link.

Certain of the input, output and junction points of the active filter may be joined by resistors, each acting as a negative resistor to provide Q-factor enhancement for a resonant circuit formed between the two points to which the particular resistor is connected.

One example of a generalized negative impedance converter is a two-port network having one terminal earthed at each port, with the other terminal connected to a respective input of a high gain d.c. amplifier with a differential input. Impedances, the ratio between which defines the negative of the conversion ratio of the converter, are connected from the output of the amplifier to its inputs. The amplifier may be an integrated circuit operational amplifier. The polarity of connection of the amplifier should be chosen to provide overall stability for the active filter. Limiting diodes may be required for stability on switch-on.

In another example the generalized negative impedance converters are constructed in pairs, using two converters as described above connected in series, with the difference that the feedback connection to the non-inverting input of each amplifier is taken to the non-inverting input of the other amplifier. The converters may be constructed in groups of any number with modifications to the feedback connections.

According to another aspect of the present invention there is provided a method of constructing an active filter having the same characteristics as a predetermined passive filter formed by capacitors and inductors with or without other components, the method including notionally dividing the passive filter into a first set of one or more capacitors including at least one capacitor not connected directly to earth and a second set of one or more inductors, the two sets being joined at a one or more junction points and by earth connections, replacing the first set by a topologically equivalent connected first set of resistors, replacing the second set by a topologically equivalent connected second set of resistors, connecting the first set of resistors to the junction points by a first plurality of generalized negative impedance converters having conversion ratios effective to convert resistances into negative capacitances, connecting the second set of resistors to the junction points by a second plurality of generalized negative impedance converters having conversion ratios effective to convert resistances into negative inductances, and providing other generalized negative impedance converters for the connection of any other components to any of the junction points as are included in the passive filter, or modifying such other components and connecting each to either the first or the second sets of resistors so as to utilize one of the first or second plurality of generalized negative impedance converters to connect the other component.

In order that the invention may be fully understood and readily carried into effect it will now be described with reference to the accompanying drawings, of which:

In accordance with the invention there is produced an active network which has the same characteristics as a passive network including capacitors and inductors, in which the active network includes two resistor networks connected to each other and to adjacent networks by generalized negative impedance converter (GNIC) circuits. One of the said resistor networks is topologically the same as the capacitor part of the original passive network, and the other is topologically identical to the inductor part of the original passive network. One practical realization of a GNIC circuit shown in FIG. 1 contains one operational amplifier A having connected respectively in positive and negative feedback paths from the output to inputs of the amplifier a first impedance $Z_1$ and a second impedance $Z_2$. The impedances $Z_1$ and $Z_2$ are a first resistor and either a capacitor or a second resistor. The input terminals of the amplifier A are respectively connected to a terminal each of ports 1 and 2, the other terminals of the ports being directly connected together. The polarity of the amplifier, and consequently the senses of the feedback paths, are determined by stability considerations in the complete active network, and may be reversed from that shown in FIG. 1. All the capacitors in the final network can, but need not, be made equal to a single preferred value and any problems of component selection is transferred to a choice of resistor values, as will become evident from the description following.

Figure 1:
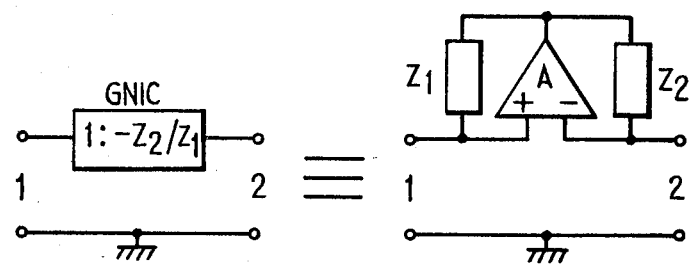
FIG. 1 shows in diagrammatic form one example of a generalized negative impedance converters (GNIC) and the symbol used for it in other figures.

Also shown in FIG. 1 is the symbol to be used to represent a GNIC circuit in the active filters to be described. If a GNIC circuit is reversed, its conversion ratio in one direction is the inverse of that in the other direction; i.e., from left to right the conversion ratio is $-Z_1/Z_2$ and from right to left it is $-Z_2/Z_1$. The symbol used also indicates the conversion ratio in relation to the direction of connection of the circuit.

Figure 2:
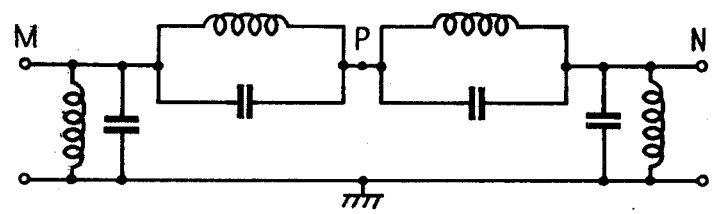
FIG. 2 shows one example of a filter constructed with passive components.
Figure 3:
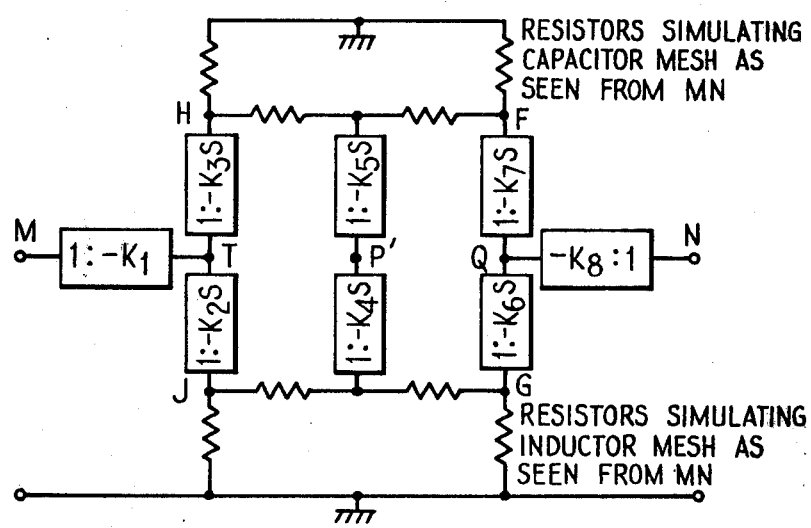
FIG. 3 shows an active filter equivalent to the filter of FIG. 2 according to an example of the invention.

FIG. 2 shows a typical passive LC circuit, which in this case is a two port with a grounded common terminal to both ports. This circuit may be simulated as shown in FIG. 3 where the upper mesh of resistors replaces the capacitors of the original circuit and the lower resistor mesh replaces the inductors. The conversion ratios of the GNICs are as shown in the blocks where $K_1, K_2, \ldots, K_8$ are numbers related by the expressions:

$$K_2 K_3 = K_4 K_5 = K_6 K_7 \tag{1}$$

and $$K_1 K_3 = K_7 K_8 \tag{2}$$

The factor s shown in FIG. 3 is the complex frequency variable and is introduced by making one of the impedances of the GNIC circuit a capacitor.

Figure 4:
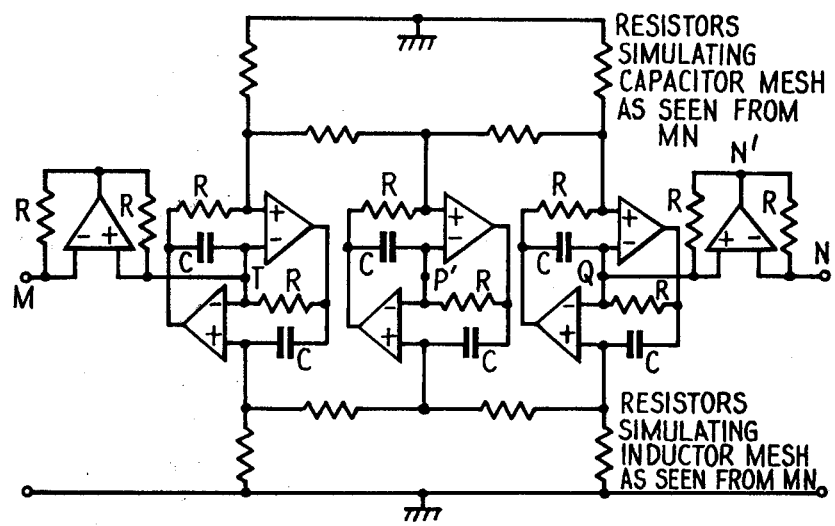
FIG. 4 shows in more detail the circuit of FIG. 3.

A simple way of ensuring that these conditions are fulfilled is to make $K_1 = K_8 = 1$ and to make $K_2 = K_3 = K_4 = K_5 = K_6 = K_7$. In this way all of the resistors in the GNIC circuits can be made the same value and all the capacitors can be equal to a single preferred value. The circuit that results is shown in FIG. 4 where the 1:−1 GNICs are here realized separately and the 1:−Ks GNICs are realized in pairs. It has been found that a good stable performance is achieved by combining GNIC circuits in pairs as shown. It must, however, be understood that there are many other GNIC circuits and combinations of GNICs which could be employed.

The two GNIC circuits joining node M to node T and node N to node Q are used as buffer elements between the external components connected to the nodes M and N and the negative impedance "world" existing within the active filter itself. Any positive resistance connected from the node T, for example, to earth appears as a negative resistance connected from the node M to earth; the use of this technique to enhance Q-factors within the filter is described later.

Any external circuits which are connected to the original network of FIG. 2 must be redesigned to have the same impedance as seen from nodes M and N before and after the conversion to active form of the network. This requirement applies whether, as in a first case, the external circuit is connected between the original circuit and earth or, as in a second case, between the original circuit and any other zero impedance point; for example a voltage source.

Figure 5:
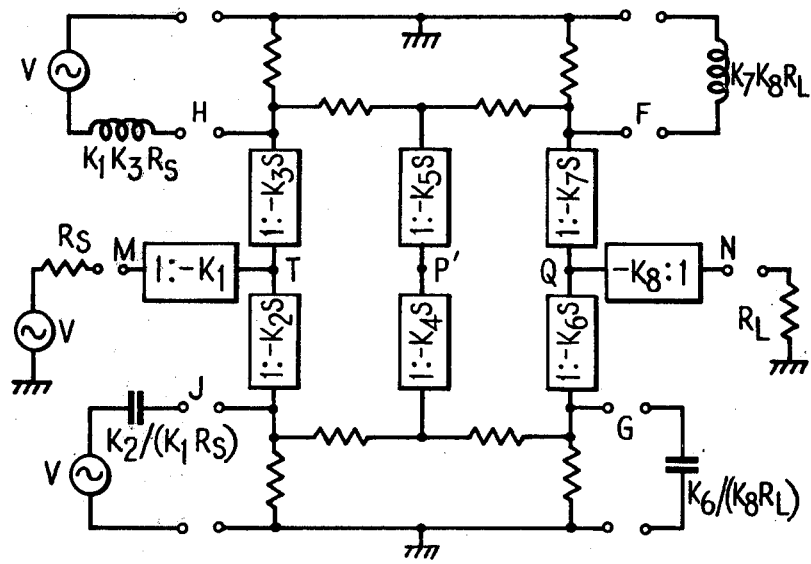
FIG. 5 shows some modifications to the circuit of FIG. 3.

To illustrate the first case consider, in FIG. 2, a resistor of value $R_L$ connected between node N and earth. After simulation of the original network by the circuit of FIG. 3 the same value resistor $R_L$ may be connected between the node N and earth, but this requires the provision of the GNIC $K_8$. FIG. 5 shows two other ways of simulating that same resistance in which the GNIC $K_8$ is not required. An inductor of value $K_7 K_8 R_L$ may be connected between node F and earth or more usefully a capacitor of value $K_6/(K_8 R_L)$ between node G and earth.

If the resistor $R_L$ formed the only component adjoining the original network at N, replacement by an inductor at F or a capacitor at G would make the GNIC $K_8$ between N and Q redundant. If an output from N were required this could instead be obtained from F, G or even Q, since all these nodes carry the same signal voltage. If is worth noting however that, in the particular realization of the filter shown in FIG. 4, connection of the load resistor $R_L$ between the node N and earth allows for a buffered output to be obtained at node N', where the signal voltage is directly proportional to that at N.

As an example of the second case consider in FIG. 2 a resistor of value $R_s$ connected from a voltage source V to the node M. This could be simulated in the three different alternative ways shown in FIG. 5. A resistor of value $R_s$ may simply be connected from the source V to the node M, an inductor of value $K_1 K_3 R_s$ may be connected from the source V to node H or more practically a capacitor of value $K_2/(K_1 R_s)$ may be connected from the source V to node J. As in the first case replacement of $R_s$ at M by an inductor at H or a capacitor at J would make the GNIC at M redundant. p It has been found in practice that, although the LC resonances of filters constructed in accordance with the technique described above have high Q-factors, in critical bandpass applications some Q-factor enhancement is desirable. This Q-factor enhancement can be provided for an individual LC resonance by introducing negative resistance across that resonant circuit. A negative resistance may be simulated between any two nodes of the circuit of FIG. 2 by connecting a positive resistor between appropriate nodes of its corresponding active circuit because of the impedance negation produced by the GNICs. For example connection of a resistor of value R between nodes T and P' of FIG. 3 is equivalent to connecting a resistor of value −R between nodes M and P of FIG. 2, and a resistor of R between nodes T and earth in FIG. 4 or 5 appears as −R between M and earth in FIG. 2.

The technique of improving Q-factors as just described works well when certain restrictions on the conversion ratios of the GNICs have been applied. In the example of FIG. 3 if $K_1 = K_8$ and $K_3 = K_5 = K_7$ then from equation (1) it follows that $K_2 = K_4 = K_6$. Under these conditions a resistor between the two ungrounded nodes T and P′ simulates only an ungrounded negative resistor between nodes M and P and no unwanted grounded elements are introduced. These simplifying conditions are automatically present when $K_1 = K_8 = 1$ and $K_2 = K_3 = K_4 = K_5 = K_6 = K_7$ as in FIG. 4.

The production of negative resistors for Q-enhancement as described above indicates the possibility of producing other negative impedance elements. Such a feasibility would allow specifications for filters to be satisfied by ladder configurations, for example, which would previously have been neglected on the grounds that they required negative element values. Negative capacitances can be generated in the same locations as negative resistors by adding capacitors in the appropriate places, but negative inductances would require additional GNIC circuits.

Figure 6:
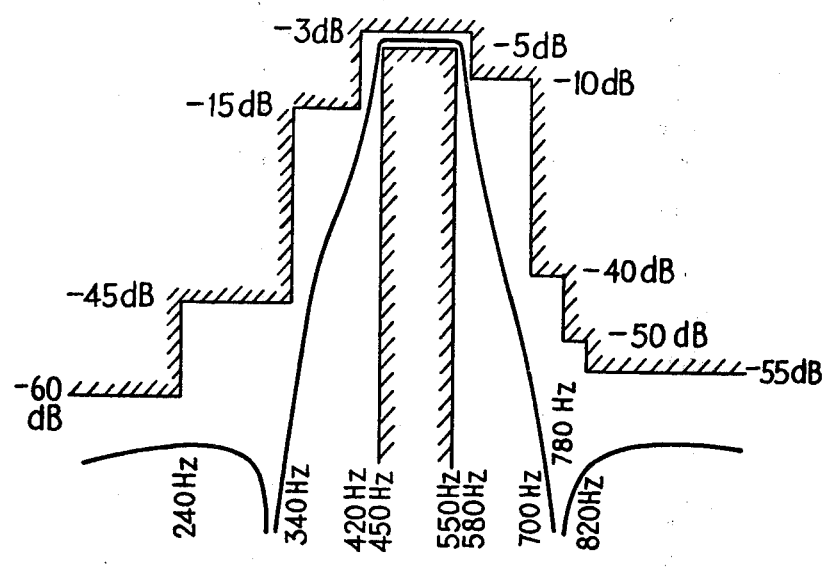
FIG. 6 shows an example of a template of a filter specification and a characteristic chosen to fit it.
Figure 7:
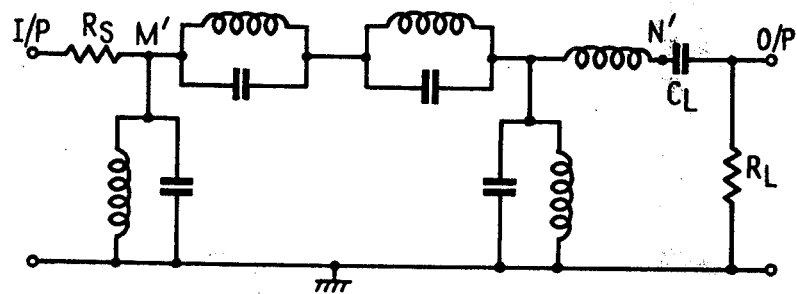
FIG. 7 shows a filter constructed with passive elements having the characteristic shown in FIG. 6.

A practical filter design using the techniques set out above will now be described. It is a narrow bandpass filter designed to pass frequencies between 450 Hz and 550 Hz. The gain/frequency specification template is shown in FIG. 6 along with a plot of the 8th order, 0.1 dB ripple, bar type, elliptic transfer function which was found to meet that specification. A 4-branch, LC passive filter designed to realize that transfer function is shown in FIG. 7. This passive filter design is equivalent to an active filter design having the same specification which is shown in FIGS. 8 and 9.

Figure 8:
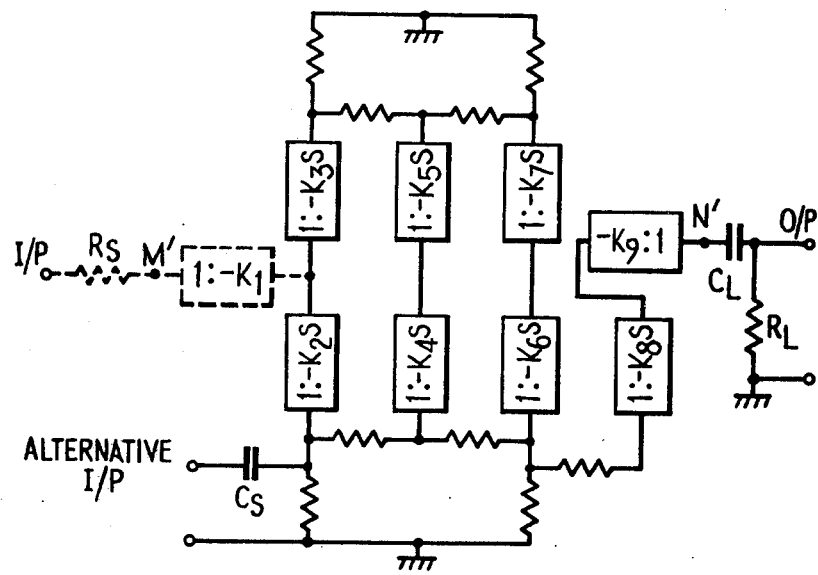
FIG. 8 shows an active filter according to an example of the invention which is equivalent to the filter of FIG. 7.
Figure 9:
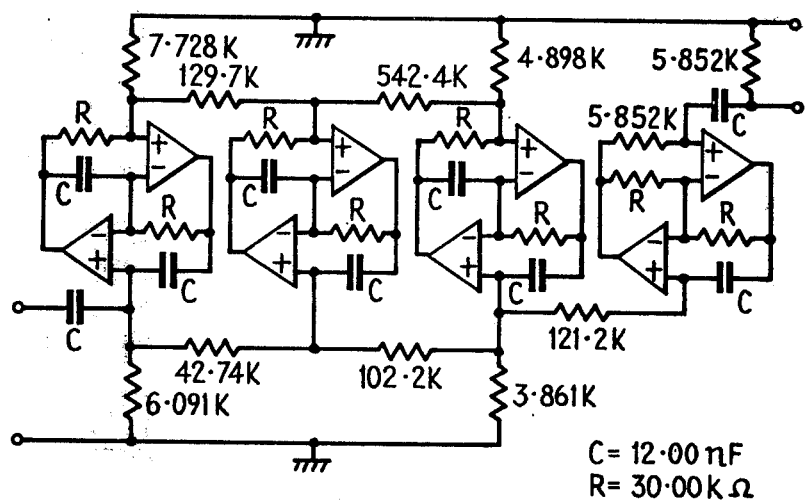
FIG. 9 shows in more detail the circuit of FIG. 8.

The inductance and capacitance meshes between nodes M′ and N′, of FIG. 7, are realized by resistor networks connected to each other and to the adjoining circuits by GNIC circuits as shown in FIG. 8. An alternative input is provided through the capacitor $C_s$ making the resistor $R_s$ and the GNIC at the node A redundant as discussed previously. The conversion ratios of the GNICs are chosen to allow all the capacitors to be 12 nF and sufficient freedom of choice of component values still remains to fix the constants of the conversion ratios so that they are related as follows:

$$K_2 = K_3 = K_4 = K_5 = K_6 = K_7 = K_8$$

The GNICs are realized in pairs in a similar manner to that in FIG. 4 but in addition GNICs $K_8$ and $K_9$ also form a pair. The resulting circuit is shown in FIG. 9.

If when the filter is constructed it is found that the gain at some part of the passband is lower than it should be due to the resonant-circuit Q-factors being less than ideal, the simple Q-enhancement technique described above can be used to correct the response. In one example the addition of some loose-tolerance resistors in parallel with the topological equivalent of the parallel resonant circuit produced the desired result. The resistor values were determined empirically. Further resistors could have been added to make the response nearly perfect but those just mentioned were found to be sufficient to place the response of the filter well within its specification.

It will be appreciated that any kind of generalized negative impedance converter could be used in implementing the invention provided that the conversion ratio can be arranged to have the correct value for the filter circuit to be constructed whilst the invention may be used to provide an active filter equivalent to a passive filter, it should be understood that the passive filter itself need not necessarily be physically realizable using solely passive elements.

I claim:

1. An active filter including
   a first set of resistors connected to form a first network having a ground connection and a plurality of terminals connected to respective points of the first network,
   a second set of resistors connected to form a second network having a ground connection and a plurality of terminals connected to respective points of the second network,
   a first group of generalized negative impedance converters, each having a conversion ratio effective to convert resistance into negative capacitance,
   a second group of generalized negative impedance converters, each having a conversion ratio effective to convert resistance into negative inductance,
   means connecting the generalized negative impedance converters of the first group from the terminals of the first network to a plurality of junction points,
   means connecting the generalized negative impedance converters of the second group from the terminals of the second network to the plurality of junction points, and
   input and output means connected from input and output terminals of the filter to selected ones of the junction points and the terminals of the first and second networks of resistors,
   whereby the filter has a transfer function which is the same as that of a passive filter including a network of capacitors corresponding to the first network of resistors connected to a network of inductors corresponding to the second network of resistors, with input and output connections corresponding to the connections of the input and output means to the junctions and terminals of the first and second networks of resistors, taking into account the transfer junctions of the input and output means.

2. An active filter according to claim 1 wherein the input means is connected to a first of the junction points and the output means is connected to a second of the junction points, and both the input means and the output means comprise impedance inverters.

3. An active filter according to claim 1 wherein a generalized negative impedance converter of the first group and a generalized negative impedance converter of the second group, which are both connected to the same junction point, are constructed as a pair of converters in which feedback connections of each converter are connected to the output of the amplifier of the other converter.

4. An active filter according to claim 1, wherein the input means is connected to a terminal of the first network of resistors and includes a series inductor.

5. An active filter according to claim 1, wherein the input means is connected to a terminal of the second network of resistors and includes a series capacitor.

6. An active filter according to claim 1, wherein the output means is connected to a terminal of the first network of resistors and includes a shunt inductor.

7. An active filter according to claim 1, wherein the output means is connected to a terminal of the second network of resistors and includes a shunt capacitor.

8. An active filter according to claim 1 including a further resistor connected from one of the junction points to another point selected from the others of the junction points and ground, thereby to provide Q-enhancement of the transfer function of the filter.

9. An active filter including
a first set of resistors connected to form a first network having a ground connection and at least one terminal,
a second set of resistors connected to form a second network having a ground connection and at least one terminal,
a first generalized negative impedance converter having a conversion ratio effective to convert resistance into negative capacitance and connected from the terminal of the first network of resistors to a junction point,
a second generalized negative impedance converter having a conversion ratio effective to convert resistance into negative inductance and connected from the terminal of the second network of resistors to the junction point, and
input and output means connected to respective points selected from the junction point and the terminals of the first and second networks of resistors.

10. An active filter comprising
a first set of resistors connected to form a first network having a ground connection and at least two terminals,
a second set of resistors connected to form a second network having a ground connection and at least two terminals,
first and second generalized negative impedance converters, each having a conversion ratio effective to convert resistance into negative capacitance, and respectively connected from the terminals of the first network to first and second junction points,
third and fourth generalized negative impedance converters, each having a conversion ratio effective to convert resistance into negative inductance, and respectively connected from the terminals of the second network to the first and second junction points, and
input and output means connected to respective points selected from the junction points and the terminals of the first and second networks of resistors.

11. A method of constructing an active filter having the same transfer function as a given passive filter, the method including the steps of:
analyzing the given passive filter into a first network of capacitors and a second network of inductors, which networks when joined together at a plurality of junction points and to ground form the passive filter,
constructing a third network of resistors having the same structure as the first network of capacitors, such that each capacitor of the first network is represented by a resistor in the third network having an impedance bearing a predetermined relationship to that of the particular capacitor,
constructing a fourth network of resistors having the same structure as the second network of inductors, such that each inductor of the second network is represented by a resistor in the fourth network having an impedance bearing a predetermined relationship to that of the particular inductor,
providing a plurality of first generalized negative impedance converters, each having a conversion ratio effective to convert resistance into negative capacitance,
providing a plurality of second generalized negative impedance converters, each having a conversion ratio from input to output effective to convert resistance into negative inductance,
connecting the input of a first generalized negative impedance converter to each point of the third network of resistors which corresponds to a junction point of the first network of capacitors,
connecting the input of a second generalized negative impedance converter to each point of the fourth network of resistors which corresponds to a junction point of the second network of inductors,
joining the outputs of corresponding first and second generalized negative impedance converters, and
providing input and output connections.

* * * * *